(12) United States Patent
Okumoto

(10) Patent No.: US 11,267,076 B2
(45) Date of Patent: Mar. 8, 2022

(54) SEMICONDUCTOR DEVICE AND SEMICONDUCTOR DEVICE FABRICATION METHOD

(71) Applicant: FUJI ELECTRIC CO., LTD., Kawasaki (JP)

(72) Inventor: Ryoji Okumoto, Gunma (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 347 days.

(21) Appl. No.: 16/586,417

(22) Filed: Sep. 27, 2019

(65) Prior Publication Data

US 2020/0023465 A1 Jan. 23, 2020

Related U.S. Application Data

(63) Continuation of application No. PCT/JP2018/030786, filed on Aug. 21, 2018.

(30) Foreign Application Priority Data

Oct. 19, 2017 (JP) .............................. JP2017-202252

(51) Int. Cl.
*B23K 26/20* (2014.01)
*B23K 26/32* (2014.01)
(Continued)

(52) U.S. Cl.
CPC .............. *B23K 26/21* (2015.10); *B23K 26/18* (2013.01); *B23K 26/32* (2013.01); *H01L 23/488* (2013.01);
(Continued)

(58) Field of Classification Search
CPC ................ B23K 26/18; B23K 2101/40; B23K 26/20–22; B23K 26/32–323;
(Continued)

(56) References Cited

U.S. PATENT DOCUMENTS

2007/0172980 A1 7/2007 Tanaka et al.
2007/0176294 A1* 8/2007 Wada ..................... H05K 1/114
257/774
(Continued)

FOREIGN PATENT DOCUMENTS

JP H07214369 A 8/1995
JP 2007227893 A 9/2007
(Continued)

OTHER PUBLICATIONS

International Search Report for PCT/JP2018/030786, dated Nov. 20, 2018.
Written Opinion for PCT/JP2018/030786, dated Nov. 20, 2018.

*Primary Examiner* — Michael A Laflame, Jr.
(74) *Attorney, Agent, or Firm* — Rabin & Berdo, P.C.

(57) ABSTRACT

A semiconductor device, including a semiconductor element, and a first wiring member and a second wiring member bonded to each other and being electrically connected to the semiconductor element. The first wiring member has an irradiation area for receiving irradiation of a laser beam. The semiconductor device also includes a protection member disposed on an area of the second wiring member opposite the irradiation area of the first wiring member, the protection member having a melting point higher than a melting point of at least one of the first wiring member and the second wiring member including the area on which the protection member is disposed.

11 Claims, 10 Drawing Sheets

(51) Int. Cl.
*H01L 21/60* (2006.01)
*H01L 23/48* (2006.01)
*B23K 26/21* (2014.01)
*B23K 26/18* (2006.01)
*H01L 23/488* (2006.01)
*H01L 23/00* (2006.01)
*B23K 103/10* (2006.01)
*B23K 103/12* (2006.01)

(52) U.S. Cl.
CPC .......... *H01L 24/48* (2013.01); *B23K 2103/10* (2018.08); *B23K 2103/12* (2018.08); *H01L 2224/45147* (2013.01); *H01L 2224/48247* (2013.01); *H01L 2224/49111* (2013.01); *H01L 2224/83801* (2013.01)

(58) Field of Classification Search
CPC .......... H01L 21/60; H01L 2021/60097–60112; H01L 23/48–4821; H05B 1/0227–0233
See application file for complete search history.

(56) References Cited

U.S. PATENT DOCUMENTS

| | | | |
|---|---|---|---|
| 2007/0246819 A1* | 10/2007 | Hembree | H01L 23/49827 257/698 |
| 2008/0076267 A1* | 3/2008 | Oishi | B23K 26/0676 438/785 |
| 2009/0236321 A1 | 9/2009 | Hayashi et al. | |
| 2015/0380292 A1* | 12/2015 | Tachioka | C09J 183/08 438/759 |

FOREIGN PATENT DOCUMENTS

| | | |
|---|---|---|
| JP | 2009226420 A | 10/2009 |
| JP | 2010075967 A | 4/2010 |
| JP | 2010082673 A | 4/2010 |

* cited by examiner

| PRACTICAL EXAMPLE | FIRST WIRING MEMBER | | SECOND WIRING MEMBER | | PROTECTION MEMBER | | BONDING MEMBER | | DIFFERENCE IN MELTING POINT | HEAT INPUT AMOUNT | WELDING CONDITIONS | |
|---|---|---|---|---|---|---|---|---|---|---|---|---|
| | MATERIAL | THICKNESS | MATERIAL | THICKNESS | MATERIAL | THICKNESS | MATERIAL | THICKNESS | | | PROPRIETY OF BONDING | PRESENCE OR ABSENCE OF HOLE |
| 1 | Cu | 0.5 | Cu | 0.5 | – | – | – | – | – | 50 | × | ○ |
| 2 | Cu | 0.5 | Cu | 0.5 | – | – | – | – | – | 70 | × | × |
| 3 | Cu | 0.5 | Cu | 0.5 | – | – | – | – | – | 100 | ○ | × |
| 4 | Cu | 0.5 | Cu | 1.0 | – | – | – | – | – | 100 | ○ | × |
| 5 | Cu | 0.5 | Cu | 2.0 | – | – | – | – | – | 100 | ○ | ○ |
| 6 | Cu | 0.5 | Cu | 3.0 | – | – | – | – | – | 100 | ○ | ○ |
| 7 | Cu | 0.5 | Cu | 0.5 | Ni | 0.5 | – | – | 370 | 100 | ○ | × |
| 8 | Cu | 0.5 | Cu | 0.5 | Ni | 1.0 | – | – | 370 | 100 | ○ | × |
| 9 | Cu | 0.5 | Cu | 0.5 | Ni | 1.5 | – | – | 370 | 100 | ○ | ○ |
| 10 | Cu | 0.5 | Cu | 0.5 | Fe | 0.5 | – | – | 452 | 100 | ○ | × |
| 11 | Cu | 0.5 | Cu | 0.5 | (6-4)Ti ALLOY | 0.5 | – | – | 511 | 100 | ○ | ○ |
| 12 | Cu | 0.5 | Cu | 0.5 | (6-4)Ti ALLOY | 0.4 | – | – | 511 | 100 | ○ | ○ |
| 13 | Cu | 0.5 | Cu | 0.5 | Cr | 0.25 | – | – | 777 | 100 | ○ | ○ |
| 14 | Cu | 0.5 | Cu | 0.5 | Mo | 0.1 | – | – | 1534 | 100 | ○ | ○ |
| 15 | Cu | 0.5 | Cu | 0.5 | Al₂O₃ | 0.1 | – | – | 967 | 100 | ○ | ○ |
| 16 | Cu | 0.5 | Cu | 0.5 | ZrO₂ | 0.2 | – | – | 1617 | 100 | ○ | ○ |
| 17 | Cu | 0.5 | Cu | 0.5 | Si₃N₄ | 0.2 | Ti | 0.05 | 817 | 100 | ○ | ○ |
| 18 | Cu | 0.5 | Cu | 0.5 | AlN | 0.2 | Ag-Cu-Ti | 0.04 | 1117 | 100 | ○ | ○ |
| 19 | Cu | 0.5 | Cu | 0.5 | WC | 0.1 | – | – | 1787 | 100 | ○ | ○ |

| PRACTICAL EXAMPLE | FIRST WIRING MEMBER MATERIAL | FIRST WIRING MEMBER THICKNESS | SECOND WIRING MEMBER MATERIAL | SECOND WIRING MEMBER THICKNESS | PROTECTION MEMBER MATERIAL | PROTECTION MEMBER THICKNESS | BONDING MEMBER MATERIAL | BONDING MEMBER THICKNESS | DIFFERENCE IN MELTING POINT | HEAT INPUT AMOUNT | PROPRIETY OF BONDING | PRESENCE OR ABSENCE OF HOLE |
|---|---|---|---|---|---|---|---|---|---|---|---|---|
| 20 | Al | 0.5 | Al | 0.5 | — | — | — | — | — | 20 | × | ○ |
| 21 | Al | 0.5 | Al | 0.5 | — | — | — | — | — | 30 | × | × |
| 22 | Al | 0.5 | Al | 0.5 | — | — | — | — | — | 50 | ○ | × |
| 23 | Al | 0.5 | Al | 1.0 | — | — | — | — | — | 50 | ○ | × |
| 24 | Al | 0.5 | Al | 2.0 | — | — | — | — | — | 50 | ○ | × |
| 25 | Al | 0.5 | Al | 3.0 | — | — | — | — | — | 50 | ○ | ○ |
| 26 | Al | 0.5 | Al | 0.5 | Cu | 0.4 | — | — | 423 | 50 | ○ | × |
| 27 | Al | 0.5 | Al | 0.5 | Ni | 0.2 | — | — | 798 | 50 | ○ | ○ |
| 28 | Al | 0.5 | Al | 0.5 | Co | 0.2 | — | — | 832 | 50 | ○ | ○ |
| 29 | Al | 0.5 | Al | 0.5 | Al2O3 | 0.1 | — | — | 1390 | 50 | ○ | ○ |
| 30 | Al | 0.5 | Al | 0.5 | AlN | 0.25 | — | — | 1540 | 50 | ○ | ○ |
| 31 | SUS301 | 0.5 | SUS301 | 0.5 | — | — | — | — | — | 50 | × | × |
| 32 | SUS301 | 0.5 | SUS301 | 1.0 | — | — | — | — | — | 100 | ○ | × |
| 33 | SUS301 | 0.5 | SUS301 | 0.5 | Ti | 0.5 | — | — | 260 | 50 | ○ | × |
| 34 | SUS301 | 0.5 | SUS301 | 0.5 | Nb | 0.2 | — | — | 1068 | 50 | ○ | × |
| 35 | SUS301 | 0.5 | SUS301 | 0.5 | ZrO2 | 0.1 | — | — | 1300 | 50 | ○ | ○ |
| 36 | Al | 0.5 | Cu | 0.5 | — | — | — | — | — | 70 | ○ | × |
| 37 | Al | 0.5 | Cu | 0.5 | Ni | 1.0 | — | — | 370 | 70 | ○ | × |
| 38 | Al | 0.5 | Cu | 0.5 | (6-4)Ti ALLOY | 0.5 | — | — | 511 | 70 | ○ | ○ |
| 39 | Al | 0.5 | Cu | 0.5 | Al2O3 | 0.1 | — | — | 967 | 70 | ○ | ○ |
| 40 | SUS301 | 0.5 | Cu | 0.5 | — | — | — | — | — | 70 | ○ | × |
| 41 | SUS301 | 0.5 | Cu | 0.5 | Ni | 1.0 | — | — | 370 | 70 | ○ | × |
| 42 | SUS301 | 0.5 | Cu | 0.5 | (6-4)Ti ALLOY | 0.5 | — | — | 511 | 70 | ○ | ○ |
| 43 | SUS301 | 0.5 | Cu | 0.5 | Al2O3 | 0.1 | — | — | 967 | 70 | ○ | ○ |
| 44 | Cu | 0.5 | Al | 0.5 | — | — | — | — | — | 70 | ○ | × |
| 45 | Cu | 0.5 | Al | 0.5 | Ni | 1.0 | — | — | 423 | 70 | ○ | ○ |
| 46 | Cu | 0.5 | Al | 0.5 | (6-4)Ti ALLOY | 0.5 | — | — | 793 | 70 | ○ | ○ |
| 47 | Cu | 0.5 | Al | 0.5 | Al2O3 | 0.1 | — | — | 1390 | 70 | ○ | ○ |

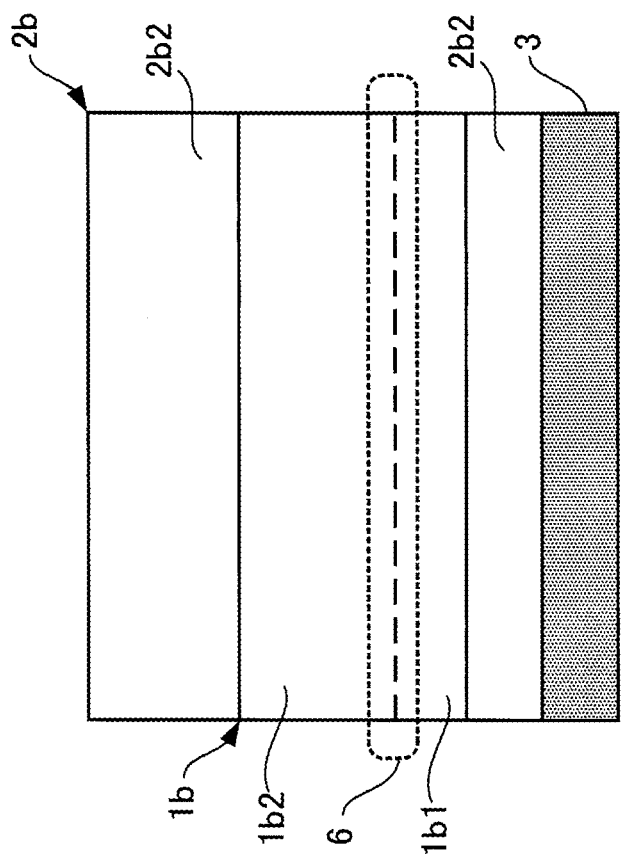
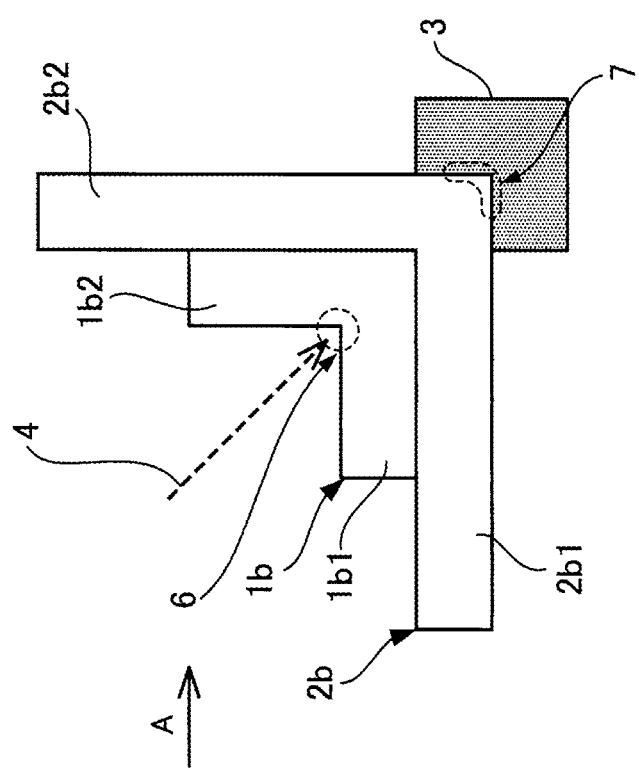
FIG. 4B
FIG. 4A

SEMICONDUCTOR DEVICE AND SEMICONDUCTOR DEVICE FABRICATION METHOD

CROSS-REFERENCE TO RELATED APPLICATION

This application is a continuation application of International Application PCT/JP2018/030786 filed on Aug. 21, 2018 which designated the U.S., which claims priority to Japanese Patent Application No. 2017-202252, filed on Oct. 19, 2017, the entire contents of which are incorporated herein by reference.

BACKGROUND OF THE INVENTION

1. Field of the Invention

The embodiments discussed herein are related to a semiconductor device and a semiconductor device fabrication method.

2. Background of the Related Art

A semiconductor device includes a plurality of power semiconductor elements and is used as, for example, a power converter of an inverter unit. A semiconductor element is a metal oxide semiconductor field effect transistor (MOSFET), an insulated gate bipolar transistor (IGBT), a freewheeling diode (FWD), or the like. In addition, a power semiconductor element is a reverse conducting (RC)-IGBT obtained by integrating an IGBT and an FWD, a reverse blocking (RB)-IGBT having a sufficient breakdown voltage against a reverse bias, or the like.

With such a semiconductor device an electrode on the back surface of a semiconductor element is bonded to a ceramic circuit board with solder. Furthermore, an electrode on the front surface of the semiconductor element through which a principal current flows is bonded to a wiring conductor with solder. In addition, an external connection terminal is bonded by laser welding to a wiring terminal electrically bonded to each electrode of the semiconductor element.

With the laser welding, for example, a first member having a laser irradiation surface is disposed and a second member whose laser absorption rate is higher than that of the first member is disposed on the opposite side of the laser irradiation surface. A first coating whose laser absorption rate is higher than that of the first member is formed under the second member. In addition, a bonding layer is interposed between the first member and the second member. At this time the bonding layer is made up of a third coating whose laser absorption rate is higher than that of the first member or whose melting point is lower than that of the first member and a second coating whose laser absorption rate is lower than that of the second member or whose melting point is higher than that of the first member. This suppresses the explosion of a molten portion at the time of irradiating the laser irradiation surface with a laser beam and good and stable laser welding is performed (see, for example, Japanese Laid-open Patent Publication No. 07-214369).

A case where an upper wiring member is placed over a lower wiring member and where laser welding is performed on them will now be described. At this time, the amount of heat needed to melt the upper wiring member made of metal is applied and the upper wiring member is bonded to the lower wiring member. However, if the amount of the energy of a laser beam is large, then a molten portion pierces the lower wiring member and a welded portion scatters from the lower wiring member or the laser beam pierces the lower wiring member. As a result, a member around the lower wiring member may burn out. In particular, in the above laser welding in the process of fabricating a semiconductor device, a laser beam or molten metal which scatters may cause a short circuit or an insulation failure of a circuit board.

As the thickness of the lower wiring member decreases, a molten portion is more apt to pierce the lower wiring member. As a result, it is difficult to control a heat input amount from a laser beam (molten portion).

SUMMARY OF THE INVENTION

According to an aspect, there is provided a semiconductor device including a semiconductor element; a first wiring member and a second wiring member bonded to each other and being electrically connected to the semiconductor element, the first wiring member having an irradiation area for receiving irradiation of a laser beam; and a protection member disposed on an area of the second wiring member opposite the irradiation area of the first wiring member, the protection member having a melting point higher than a melting point of at least one of the first wiring member and the second wiring member including the area on which the protection member is disposed.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 2 illustrates examples of materials used in the welding method according to the first embodiment (part 1);

FIG. 3 illustrates examples of materials used in the welding method according to the first embodiment (part 2);

FIGS. 4A and 4B are views for describing a welding method according to a second embodiment;

DETAILED DESCRIPTION OF THE INVENTION

Embodiments will now be described in detail with description, the same or equivalent components are marked with the same numerals and detailed descriptions of them will be omitted. Furthermore, a principal plane of a bonded member (wiring member) to which a laser beam is inputted is referred to as a front surface and the opposite principal plane is referred to as a back surface. In addition, the direction from the back surface to the front surface of a bonded member (wiring member) may be referred to as an upward direction and the direction from the front surface to the back surface of a bonded member (wiring member) may be referred to as a downward direction. In this case, the upward and downward directions do not always match the direction of gravity.

Furthermore, the present disclosure is not limited to the following embodiments. The following embodiments may be properly modified and implemented so long as their gist is not changed.

First Embodiment

A welding method according to a first embodiment will be described with reference to FIG. 1.

Figure 1:
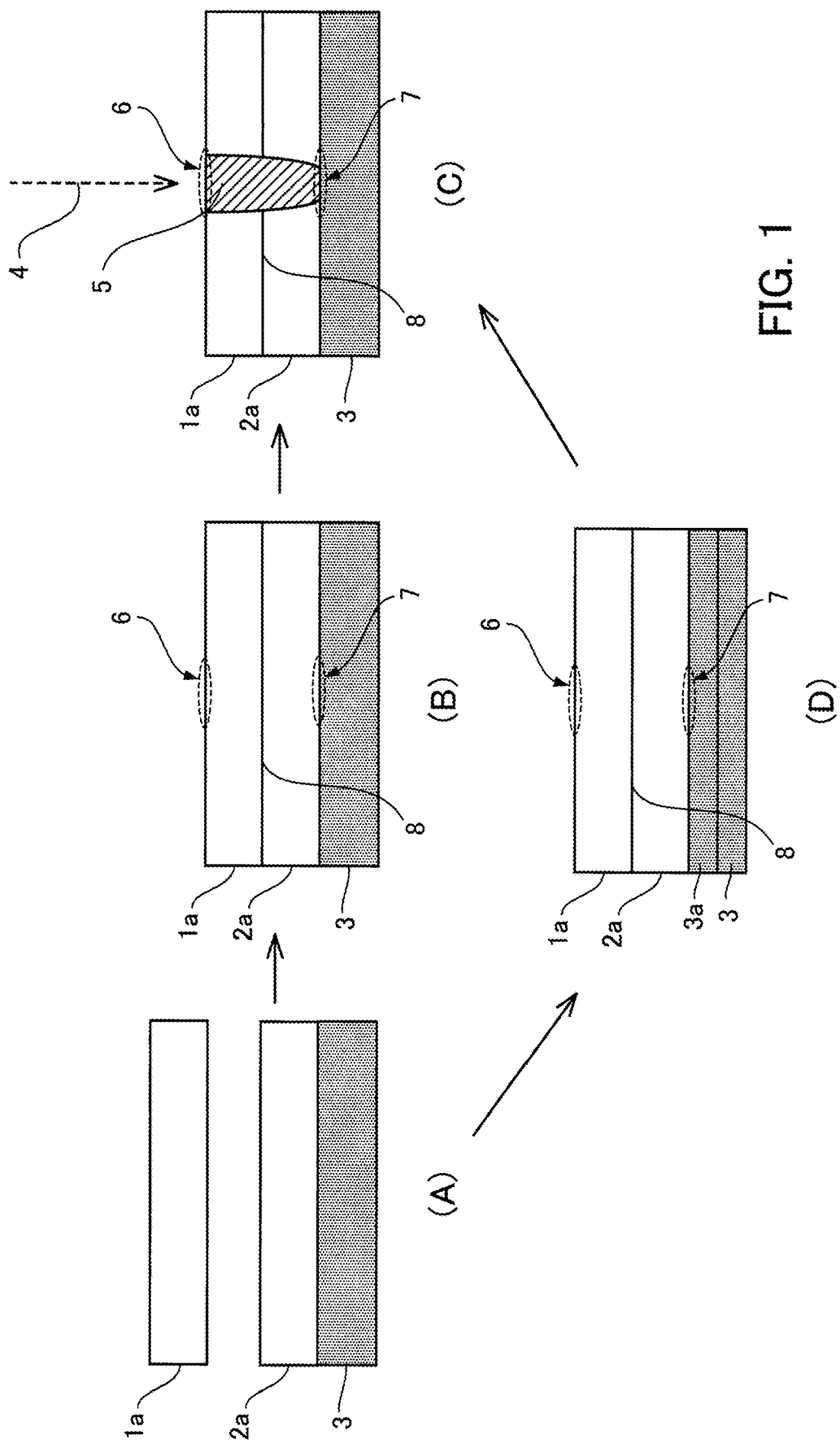
FIG. 1 is a view for describing a welding method according to a first embodiment.

FIG. 1 is a view for describing a welding method according to a first embodiment. A welding method is illustrated on a time-series basis ((A) through (C) of FIG. 1). However, (D) of FIG. 1 illustrates another form of (B) of FIG. 1.

First a (upper) first wiring member 1a and a (lower) second wiring member 2a which are to be bonded together are prepared. A protection member 3 is disposed under the back surface of the second wiring member 2a. The protection member 3 disposed under the back surface of the second wiring member 2a is located as clad metal or formed by plating treatment or a spraying method, depending on a material. In addition, there is a need to dispose the protection member 3 so as to cover at least an area described later.

The above protection member 3 is made of a material whose melting point is higher than those of the first wiring member 1a and the second wiring member 2a. Metal or a ceramic material is used as the protection member 3. If adhesion of the protection member 3 to the second wiring member 2a is improved according to a material for the protection member 3, it is desirable, as illustrated in (D) of FIG. 1, to form the protection member 3 with a bonding member 3a between the back surface of the second wiring member 2a and the protection member 3. Furthermore, metal such as cobalt (Co), titanium (Ti), platinum (Pt), chromium (Cr), molybdenum (Mo), tantalum (Ta), tungsten (W), niobium (Nb), or an alloy containing at least one of them is used as the protection member 3. Alternatively, a ceramic material such as aluminum oxide ($Al_2O_3$), zirconium oxide ($ZrO_2$), silicon oxide ($SiO_2$), silicon carbide (SiC), boron carbide ($B_4C$), tungsten carbide (WC), tantalum carbide (TaC), aluminum nitride (AlN), silicon nitride ($Si_3N_4$), titanium nitride (TiN), or tantalum nitride (TaN) is used as the protection member 3. Each of the first wiring member 1a and the second wiring member 2a has the shape of a plate and is made of metal such as copper (Cu), aluminum (Al), an alloy containing at least one of them, or stainless steel.

A method for welding the first wiring member 1a and the second wiring member 2a together will be described. First, as illustrated in (A) of FIG. 1, the first wiring member 1a and the second wiring member 2a under whose back surface the protection member 3 is disposed are prepared.

Next, as illustrated in (B) of FIG. 1, the principal plane of the first wiring member 1a is placed over the principal plane of the second wiring member 2a. In this case, placing the first wiring member 1a over the second wiring member 2a is an example and another method may be adopted. For example, part of the first wiring member 1a may be placed over part of the second wiring member 2a. Furthermore, it may be that the first wiring member 1a and the second wiring member 2a are not equal in shape or thickness or that the first wiring member 1a and the second wiring member 2a are not made of the same material.

At this time the protection member 3 is disposed under an area 7 opposite an irradiation area 6 of the first wiring member 1a irradiated with a laser beam 4. The first wiring member 1a is placed over the second wiring member 2a. The protection member 3 is disposed under the area 7 of at least one of the first wiring member 1a and the second wiring member 2a. In this case, the second wiring member 2a is bonded to the first wiring member 1a on a bonding plane 8. Furthermore, the irradiation area 6 is set on a first principal plane (front surface) of the first wiring member 1a opposite the bonding plane 8. In addition, the protection member 3 is disposed under the area 7 of a second principal plane (back surface) of the second wiring member 2a opposite the bonding plane 8.

Next, as illustrated in (C) of FIG. 1, the irradiation area 6 of the front surface of the first wiring member 1a is irradiated with the laser beam 4. At this time the laser beam 4 generates heat to the extent that part of the first wiring member 1a and part of the second wiring member 2a are melted. Such a laser beam is generated by the use of an ordinary laser irradiation apparatus such as an yttrium aluminum garnet (YAG) laser, a fiber laser, or a carbon dioxide laser. Because of a heat input from the laser beam 4, the first wiring member 1a and the second wiring member 2a are melted in the depth direction from the irradiation area 6 and a welded portion 5 is formed. However, the melting point of the protection member 3 is higher than that of the second wiring member 2a including the area 7. Therefore, at this time the protection member 3 is hardly melted by the laser beam 4. This prevents the laser beam 4 from piercing the protection member 3 and prevents a molten piece of the molten second wiring member 2a from scattering or dropping. After this, the first wiring member 1a and the second wiring member 2a are cooled to solidify the welded portion 5. By doing so, the first wiring member 1a and the second wiring member 2a are bonded together.

The first wiring member 1a, the second wiring member 2a, and the protection member 3 (and the bonding member 3a) used in the above welding method will now be described with reference to FIGS. 2 and 3.

FIGS. 2 and 3 illustrate examples of materials used in the welding method according to the first embodiment. Combinations of materials for the first wiring member 1a, the second wiring member 2a, and the protection member 3 (and the bonding member 3a) illustrated in FIG. 1, a heat input amount from the laser beam 4, and welding conditions at that time are indicated in practical examples 1 through 47 in FIGS. 2 and 3. However, practical examples 1 through 6, 20 through 25, 31, 32, 36, 40, and 44 are reference examples in which welding is performed without using the protection member 3. Furthermore, materials for the first wiring member 1a, the second wiring member 2a, and the protection member 3 (and the bonding member 3a), their thicknesses, and a heat input amount from the laser beam 4 in practical examples 1 through 47 are examples. Other materials, other thicknesses, and other heat input amounts from the laser beam 4 may be adopted.

"Material" and "Thickness" of "First Wiring Member," "Second Wiring Member," "Protection Member," and "Bonding Member," "Difference in Melting Point" (between "Second Wiring Member" and "Protection Member"), and "Heat Input Amount" by the laser beam 4 are indicated in practical examples 1 through 47. The unit of "Thickness" is the millimeter (mm), the unit of "Difference in Melting Point" is the Celsius degree (° C.), and the unit of "Heat Input Amount" is the joule (J).

In the above practical examples 1 through 47, the protection member 3 is located as clad metal or formed by plating treatment or a spraying method, depending on a material, under the back surface of the second wiring member 2a illustrated in FIG. 1. The first wiring member 1a is disposed over the front surface of the second wiring member 2a. 20 samples formed in this way are prepared for each of practical examples 1 through 47. Furthermore, the front surface of the first wiring member 1a in each sample is irradiated perpendicularly with the laser beam 4 by the use of a YAG laser for 20 milliseconds (msec) at a laser power of 1 to 5 kW (heat input amount is larger than or equal to J and smaller than or equal to 100 J). "Propriety of Bonding" and "Presence or Absence of Hole" are set as "Welding Conditions" at the time of irradiating the front surface of the first wiring member 1a in this way with the laser beam 4.

Bonding strength is evaluated for all of the 20 samples. If a tensile strength of 40 N or more is realized for all of the 20 samples, then "Propriety of Bonding" is marked with "o". If tensile strength is lower than 40 N for any of the 20 samples, then "Propriety of Bonding" is marked with "x".

The back surface of the protection member 3 is confirmed with a 150-power microscope. If no hole is made for all of the 20 samples, then "Presence or Absence of Hole" is marked with "o". If a hole is made for any of the 20 samples, then "Presence or Absence of Hole" is marked with "x".

First a case where the first wiring member 1a and the second wiring member 2a are made of copper (Cu) (practical examples 1 through 19) will be described. If the protection member 3 is not disposed (practical examples 1 through 6), a hole appears for the first wiring member 1a with a thickness of 0.5 mm and the second wiring member 2a with a thickness of 1.0 mm or less. This makes it impossible to bond the first wiring member 1a and the second wiring member 2a together. If the thickness of the second wiring member 2a is greater than or equal to 2.0 mm, then it is possible to bond the first wiring member 1a and the second wiring member 2a together. In this case, a hole does not appear in the back surface of the second wiring member 2a. That is to say, if the second wiring member 2a is thin, then it will be difficult to bond the first wiring member 1a and the second wiring member 2a together without a hole appearing. In particular, if the first wiring member 1a and the second wiring member 2a are made of copper (Cu) and the thickness of the second wiring member 2a is smaller than two times the thickness of the first wiring member 1a, then it is impossible to bond the first wiring member 1a and the second wiring member 2a together.

Furthermore, it is assumed that the thicknesses of the first wiring member 1a and the second wiring member 2a are 0.5 mm and that the protection member 3 is made of nickel (Ni) (practical examples 7 through 9). If the thickness of the protection member 3 is 1.5 mm, then it is possible to bond the first wiring member 1a and the second wiring member 2a together without a hole appearing in the back surface of the protection member 3. That is to say, 2.0 mm or more will be needed as the total thickness of the second wiring member 2a and the protection member 3. Therefore, in order to bond the first wiring member 1a and the second wiring member 2a together without a hole appearing in the back surface of the protection member 3, it will be impossible to make the welded portion 5 formed in the first wiring member 1a and the second wiring member 2a thin (short).

In addition, it is assumed that the protection member 3 is made of iron (Fe) (practical example 10). It is possible to bond the first wiring member 1a and the second wiring member 2a together. However, a hole appears in the back surface of the protection member 3. Furthermore, it is assumed that the protection member 3 is made of a (6-4) titanium (Ti) alloy, chromium (Cr), molybdenum (Mo), aluminum oxide ($Al_2O_3$), zirconium oxide ($ZrO_2$), or tungsten carbide (WC) (practical examples 11 through 16 and 19). In all of these cases, it is possible to bond the first wiring member 1a and the second wiring member 2a together without a hole appearing in the back surface of the protection member 3. That is to say, according to practical examples 10 through 16 and 19, if the difference in melting point between the second wiring member 2a and the protection member 3 is 500° C. or more, it will be possible to bond the first wiring member 1a and the second wiring member 2a together without a hole appearing in the back surface of the protection member 3. In addition, in this case, it is possible to bond the first wiring member 1a and the second wiring member 2a together, even if the thickness of the protection member 3 is greater than or equal to 0.1 mm and smaller than or equal to 0.2 mm and the total thickness of the second wiring member 2a and the protection member 3 is smaller than two times the thickness of the first wiring member 1a.

Furthermore, in practical examples 17 and 18, the protection member 3 is disposed under the back surface of the second wiring member 2a with the bonding member 3a therebetween. In practical example 17, the bonding member 3a is made of titanium (Ti) and the protection member 3 is made of silicon nitride ($Si_3N_4$). In practical example 18, the bonding member 3a is made of silver-copper-titanium (Ag—Cu—Ti) and the protection member 3 is made of aluminum nitride (AlN). In practical examples 17 and 18, it is possible to bond the first wiring member 1a and the second wiring member 2a together without a hole appearing in the back surface of the protection member 3.

Next, a case where the first wiring member 1a and the second wiring member 2a are made of aluminum (Al) (practical examples 20 through 30) will be described. If the protection member 3 is not disposed (practical examples 20 through 25), a hole appears for the first wiring member 1a with a thickness of 0.5 mm and the second wiring member 2a with a thickness of 2.0 mm or less. This makes it impossible to bond the first wiring member 1a and the second wiring member 2a together. If the thickness of the second wiring member 2a is greater than or equal to 3.0 mm, then it is possible to bond the first wiring member 1a and the second wiring member 2a together without a hole appearing in the back surface of the second wiring member 2a. That is to say, if the second wiring member 2a is thin, then it will be difficult to bond the first wiring member 1a and the second wiring member 2a together without a hole appearing. In particular, if the first wiring member 1a and the second wiring member 2a are made of aluminum (Al) and the thickness of the second wiring member 2a is smaller than four times the thickness of the first wiring member 1a, then it is impossible to bond the first wiring member 1a and the second wiring member 2a together.

In addition, it is assumed that the protection member 3 is made of copper (Cu) (practical example 26). In practical example 26, a hole appearing in the back surface of the protection member 3 is confirmed. Bonding between the first wiring member 1a and the second wiring member 2a is confirmed. Furthermore, it is assumed that the protection member 3 is made of nickel (Ni), cobalt (Co), aluminum oxide ($Al_2O_3$), or aluminum nitride (AlN) (practical examples 27 through 30). In all of these cases, the following is confirmed. The first wiring member 1a and the second wiring member 2a are bonded together without a hole appearing in the back surface of the protection member 3.

That is to say, if the difference in melting point between the second wiring member 2a and the protection member 3 is 500° C. or more, then it will be possible to bond the first wiring member 1a and the second wiring member 2a together without a hole appearing in the back surface of the protection member 3. In addition, in this case, it is possible to bond the first wiring member 1a and the second wiring member 2a together, even if the thickness of the protection member 3 is greater than or equal to 0.1 mm and smaller than or equal to 0.25 mm and the total thickness of the second wiring member 2a and the protection member 3 is smaller than four times the thickness of the first wiring member 1a.

Next, a case where the first wiring member 1a and the second wiring member 2a are made of stainless steel (SUS301) will be described. If the protection member 3 is not disposed (practical examples 31 and 32), then bonding is insufficient or a hole appearing is confirmed. If the thickness of the second wiring member 2a is smaller than two times the thickness of the first wiring member 1a, then bonding is impossible. Furthermore, if the protection member 3 is made of titanium (Ti) (practical example 33), then a hole which appears in the back surface of the protection member 3 is confirmed. Bonding between the first wiring member 1a and the second wiring member 2a is confirmed. In addition, if the protection member 3 is made of niobium (Nb) or zirconium oxide ($ZrO_2$) (practical examples 34 and 35), then it is possible to bond the first wiring member 1a and the second wiring member 2a together without a hole appearing in the back surface of the protection member 3. That is to say, if the difference in melting point between the second wiring member 2a and the protection member 3 is 500° C. or more, then it will be possible to bond the first wiring member 1a and the second wiring member 2a together without a hole appearing in the back surface of the protection member 3. In addition, in this case, it is possible to bond the first wiring member 1a and the second wiring member 2a together, even if the thickness of the protection member 3 is greater than or equal to 0.1 mm and smaller than or equal to 0.2 mm and the total thickness of the second wiring member 2a and the protection member 3 is smaller than two times the thickness of the first wiring member 1a.

Next, a case where the first wiring member 1a is made of aluminum (Al), the second wiring member 2a is made of copper (Cu), and the thicknesses of the first wiring member 1a and the second wiring member 2a are 0.5 mm (practical examples 36 through 39) will be described. If the protection member 3 is not disposed (practical example 36) and the thickness of the second wiring member 2a is 0.5 mm, then it is possible to bond the first wiring member 1a and the second wiring member 2a together. However, a hole appears in the back surface of the second wiring member 2a. In addition, if the protection member 3 is made of nickel (Ni) (practical example 37), then a hole which appears in the back surface of the protection member 3 is confirmed. Bonding between the first wiring member 1a and the second wiring member 2a is confirmed. Furthermore, if the protection member 3 is made of a (6-4) titanium alloy or aluminum oxide ($Al_2O_3$) (practical examples 38 and 39), then it is possible to bond the first wiring member 1a and the second wiring member 2a together without a hole appearing in the back surface of the protection member 3. That is to say, if the difference in melting point between the second wiring member 2a and the protection member 3 is 500° C. or more, then it will be possible to bond the first wiring member 1a and the second wiring member 2a together without a hole appearing in the back surface of the protection member 3. In addition, in this case, it is possible to bond the first wiring member 1a and the second wiring member 2a together, even if the thickness of the protection member 3 is greater than or equal to 0.1 mm and smaller than or equal to 0.5 mm and the total thickness of the second wiring member 2a and the protection member 3 is smaller than two times the thickness of the first wiring member 1a.

Next, a case where the first wiring member 1a is made of stainless steel (SUS301), the second wiring member 2a is made of copper (Cu), and the thicknesses of the first wiring member 1a and the second wiring member 2a are 0.5 mm (practical examples 40 through 43) will be described. If the protection member 3 is not disposed (practical example 40) and the thickness of the second wiring member 2a is 0.5 mm, then it is possible to bond the first wiring member 1a and the second wiring member 2a together. However, a hole appears in the back surface of the second wiring member 2a. In addition, if the protection member 3 is made of nickel (Ni) (practical example 41), then a hole which appears in the back surface of the protection member 3 is confirmed. Bonding between the first wiring member 1a and the second wiring member 2a is confirmed. Furthermore, if the protection member 3 is made of a (6-4) titanium alloy or aluminum oxide ($Al_2O_3$) (practical examples 42 and 43), then it is possible to bond the first wiring member 1a and the second wiring member 2a together without a hole appearing in the back surface of the protection member 3. That is to say, if the difference in melting point between the second wiring member 2a and the protection member 3 is 500° C. or more, then it will be possible to bond the first wiring member 1a and the second wiring member 2a together without a hole appearing in the back surface of the protection member 3. In addition, in this case, it is possible to bond the first wiring member 1a and the second wiring member 2a together, even if the thickness of the protection member 3 is greater than or equal to 0.1 mm and smaller than or equal to 0.5 mm and the total thickness of the second wiring member 2a and the protection member 3 is smaller than two times the thickness of the first wiring member 1a.

Next, a case where the first wiring member 1a is made of copper (Cu), the second wiring member 2a is made of aluminum (Al), and the thicknesses of the first wiring member 1a and the second wiring member 2a are 0.5 mm (practical examples 44 through 47) will be described. If the protection member 3 is not disposed (practical example 44) and the thickness of the second wiring member 2a is 0.5 mm, then it is possible to bond the first wiring member 1a and the second wiring member 2a together. However, a hole appears in the back surface of the second wiring member 2a. In addition, if the protection member 3 is made of nickel (Ni) (practical example 45), then a hole which appears in the back surface of the protection member 3 is confirmed. Bonding between the first wiring member 1a and the second wiring member 2a is confirmed. Furthermore, if the protection member 3 is made of a (6-4) titanium alloy or aluminum oxide ($Al_2O_3$) (practical examples 46 and 47), then it is possible to bond the first wiring member 1a and the second wiring member 2a together without a hole appearing in the back surface of the protection member 3. That is to say, if the difference in melting point between the second wiring member 2a and the protection member 3 is 790° C. (500° C.) or more, then it will be possible to bond the first wiring member 1a and the second wiring member 2a together without a hole appearing in the back surface of the protection member 3. In addition, in this case, it is possible to bond the first wiring member 1a and the second wiring member 2a together, even if the thickness of the protection member 3 is greater than or equal to 0.1 mm and smaller than or equal to 0.5 mm and the total thickness of the second wiring member 2a and the protection member 3 is smaller than two times the thickness of the first wiring member 1a.

Therefore, according to the above results of practical examples 1 through 47 illustrated in FIGS. 2 and 3, the following are needed in order to bond the first wiring member 1a and the second wiring member 2a together without a hole appearing in the back surface of the protection member 3.

First, the first wiring member 1a and the second wiring member 2a are made of copper and the thicknesses of the first wiring member 1a and the second wiring member 2a are 0.5 mm. Furthermore, the protection member 3 is made of nickel and the total thickness of the second wiring member 2a and the protection member 3 is greater than or equal to 2.0 mm. In addition, the protection member 3 is made of a titanium alloy, chromium, molybdenum, aluminum oxide, zirconium oxide, or tungsten carbide and the difference in melting point between the second wiring member 2a and the protection member 3 is 500° C. or more.

Furthermore, the first wiring member 1a and the second wiring member 2a are made of aluminum and the thicknesses of the first wiring member 1a and the second wiring member 2a are 0.5 mm. In addition, the protection member 3 is made of nickel and the total thickness of the second wiring member 2a and the protection member 3 is greater than or equal to 3.0 mm. Moreover, the protection member 3 is made of cobalt, aluminum oxide, or aluminum nitride and the difference in melting point between the second wiring member 2a and the protection member 3 is 500° C. or more.

Furthermore, the first wiring member 1a and the second wiring member 2a are made of stainless steel and the thicknesses of the first wiring member 1a and the second wiring member 2a are 0.5 mm. In addition, the protection member 3 is made of chromium, niobium, or zirconium oxide and the difference in melting point between the second wiring member 2a and the protection member 3 is 500° C. or more.

Furthermore, the first wiring member 1a is made of aluminum, the second wiring member 2a is made of copper, and the thicknesses of the first wiring member 1a and the second wiring member 2a are 0.5 mm. In addition, the protection member 3 is made of a titanium alloy or aluminum oxide and the difference in melting point between the second wiring member 2a and the protection member 3 is 500° C. or more.

Furthermore, the first wiring member 1a is made of stainless steel, the second wiring member 2a is made of copper, and the thicknesses of the first wiring member 1a and the second wiring member 2a are 0.5 mm. In addition, the protection member 3 is made of a titanium alloy or aluminum oxide and the difference in melting point between the second wiring member 2a and the protection member 3 is 500° C. or more.

Furthermore, the first wiring member 1a is made of copper, the second wiring member 2a is made of aluminum, and the thicknesses of the first wiring member 1a and the second wiring member 2a are 0.5 mm. In addition, the protection member 3 is made of a titanium alloy or aluminum oxide and the difference in melting point between the second wiring member 2a and the protection member 3 is 500° C. or more.

Therefore, with the above welding method the first wiring member 1a is placed over the second wiring member 2a. Furthermore, the protection member 3 is disposed under the area 7 opposite the irradiation area 6 of the first wiring member 1a irradiated with the laser beam 4. The melting point of the protection member 3 is higher than that of at least one of the first wiring member 1a and the second wiring member 2a including the area 7. The irradiation area 6 is irradiated with the laser beam 4. Because the melting point of the protection member 3 is higher than that of at least one of the first wiring member 1a and the second wiring member 2a including the area 7, at this time the laser beam 4 is not melted by the laser beam 4. This prevents the laser beam 4 from piercing the protection member 3 and prevents a molten piece of the molten second wiring member 2a from scattering or dropping. After this, the first wiring member 1a and the second wiring member 2a are cooled to solidify the welded portion 5. By doing so, the first wiring member 1a and the second wiring member 2a are bonded together. In the first embodiment (FIG. 1) a case where the first wiring member 1a and the second wiring member 2a are bonded together has been described as an example. In this case, two wiring members, that is to say, the first wiring member 1a and the second wiring member 2a are used. However, the number of wiring members placed one over another is not limited to two. Three or more wiring members are welded together in the same way. One or more wiring members may be laminated between the first wiring member 1a and the second wiring member 2a. However, there is need to select the laser power of the laser beam 4 and the thickness of and a material for the protection member 3 according to the thickness of wiring members placed one over another.

Second Embodiment

In the first embodiment (FIG. 1) a case where the first wiring member 1a and the second wiring member 2a each having the shape of a flat plate are welded together has been described. The above welding method is applied to a case where each of the first wiring member 1a and the second wiring member 2a does not have the shape of a flat plate. For example, the above welding method is applied to a case described in FIGS. 4A and 4B.

FIGS. 4A and 4B are views for describing a welding method according to a second embodiment. FIG. 4A is a side view (corresponding to (C) of FIG. 1) of a first wiring member 1b and a second wiring member 2b at welding time. FIG. 4B is a front view as viewed in an arrow A direction in FIG. 4A.

In the second embodiment the first wiring member 1b has a structure in which member portions 1b1 and 1b2 each having the shape of a flat plate are bonded together so as to be at right angles (form the shape of the letter "L"). Similarly, the second wiring member 2b has a structure in which member portions 2b1 and 2b2 each having the shape of a flat plate are bonded together so as to be at right angles (form the shape of the letter "L"). In the second embodiment a protection member 3 has the same shape as the first wiring member 1b or the second wiring member 2b has. In addition, the protection member 3 in the second embodiment is also made of a material whose melting point is higher than that of at least one of the first wiring member 1b and the second wiring member 2b including an area 7.

As illustrated in FIG. 4A, the outside of the first wiring member 1b is placed over the inside of the second wiring member 2b. Furthermore, the protection member 3 is disposed, at a portion where the first wiring member 1b and the second wiring member 2b are bonded together, outside an area 7 of the first wiring member 1b and the second wiring member 2b opposite an irradiation area 6 described later and irradiated with a laser beam 4. That is to say, the protection member 3 is disposed on the outside (of the corner portion) of the second wiring member 2b. In this case, the portion where the first wiring member 1b and the second wiring member 2b are bonded together is a portion where the corner portion of the outside of the first wiring member 1b and the corner portion of the inside of the second wiring member 2b are bonded together.

Next, as illustrated in FIGS. 4A and 4B, the irradiation area 6 on the inside of the first wiring member 1b is irradiated with the laser beam 4. At this time the laser beam 4 generates heat to the extent that the first wiring member 1b and the second wiring member 2b are melted.

In this case, because of a heat input from the laser beam 4, the first wiring member 1b and the second wiring member 2b are melted in the depth direction from the irradiation area 6 and a welded portion (not illustrated) is formed. This is the same with the first embodiment. However, the melting point of the protection member 3 is higher than that of the second wiring member 2b. Therefore, at this time the protection member 3 is hardly melted by the laser beam 4. This prevents the laser beam 4 from piercing the protection member 3 and prevents a molten piece of the molten second wiring member 2b from scattering or dropping.

After this, the first wiring member 1b and the second wiring member 2b are cooled to solidify the welded portion. By doing so, the first wiring member 1b and the second wiring member 2b are bonded together. In this case, the protection member 3 may be disposed on the outside of the second wiring member 2b with a bonding member (not illustrated) therebetween. This is the same with the first embodiment. Furthermore, in the second embodiment the first wiring member 1b, the second wiring member 2b, and the protection member 3 (and the bonding member) may also be made of the materials illustrated in FIG. 2 or 3. In addition, in the second embodiment two wiring members, that is to say, the first wiring member 1b and the second wiring member 2b are used. However, the number of wiring members placed one over another is not limited to two. Three or more wiring members are welded together in the same way. One or more wiring members may be laminated between the first wiring member 1b and the second wiring member 2b. However, there is need to select the laser power of the laser beam 4 and the thickness of and a material for the protection member 3 according to the thickness of wiring members placed one over another.

Third Embodiment

A third embodiment which differs from the second embodiment will be described with reference to FIGS. 5A and 5B.

Figure 5B:
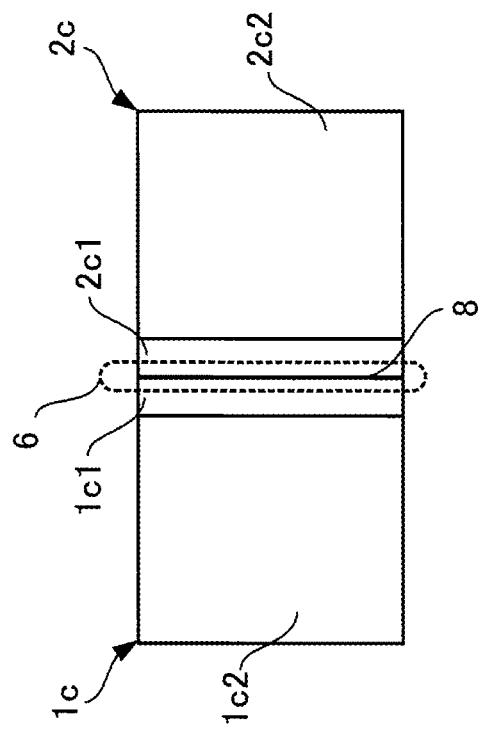
FIGS. 5A and 5B are views for describing a welding method according to a third embodiment.
Figure 5A:
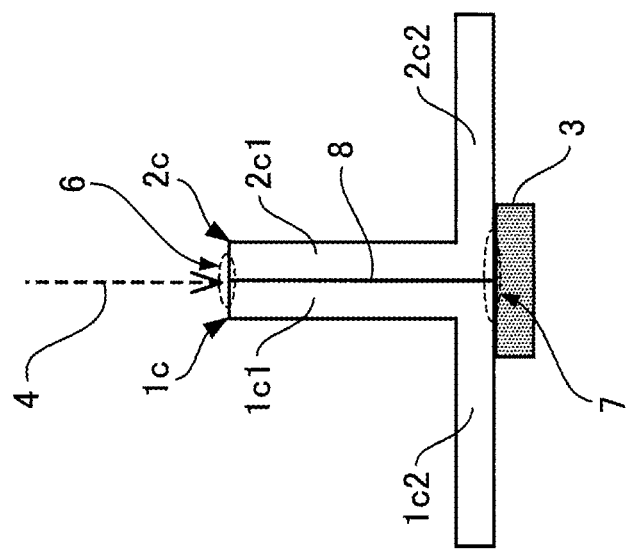

FIGS. 5A and 5B are views for describing a welding method according to a third embodiment. FIG. 5A is a side view (corresponding to (C) of FIG. 1) of a first wiring member 1c and a second wiring member 2c at welding time. FIG. 5B is a top view of the direction of irradiation of a laser beam 4 illustrated in FIG. 5A.

In the third embodiment the first wiring member 1c has a structure in which member portions 1c1 and 1c2 each having the shape of a flat plate are bonded together so as to be at right angles (form the shape of the letter "L"). Similarly, the second wiring member 2c has a structure in which member portions 2c1 and 2c2 each having the shape of a flat plate are bonded together so as to be at right angles (form the shape of the letter "L"). In the third embodiment a protection member 3 has the shape of a flat plate. This is the same with the first embodiment. In addition, the protection member 3 in the third embodiment is also made of a material whose melting point is higher than that of at least one of the first wiring member 1c and the second wiring member 2c including an area 7.

As illustrated in FIG. 5A, the outside of the member portion 1c1 of the first wiring member 1c and the outside of the member portion 2c1 of the second wiring member 2c are placed together. One end portion of the member portion 1c1 and one end portion of the member portion 2c1 form an irradiation area 6 irradiated with the laser beam 4. The one end portion of the member portion 1c1 and the one end portion of the member portion 2c1 are perpendicular to a bonding plane 8 at which the member portion 1c1 of the first wiring member 1c and the member portion 2c1 of the second wiring member 2c are bonded together. The protection member 3 is disposed on the other end portions of the member portion 1c1 of the first wiring member 1c and the member portion 2c1 of the second wiring member 2c opposite the irradiation area 6.

Next, as illustrated in FIGS. 5A and 5B, the irradiation area 6 of the member portion 1c1 of the first wiring member 1c and the member portion 2c1 of the second wiring member 2c is irradiated with the laser beam 4. At this time the laser beam 4 generates heat to the extent that the first wiring member 1c and the second wiring member 2c are melted. In this case, because of a heat input from the laser beam 4, the member portion 1c1 of the first wiring member 1c and the member portion 2c1 of the second wiring member 2c are melted and a welded portion (not illustrated) is formed. This is the same with the first embodiment. However, the melting point of the protection member 3 is higher than those of the first wiring member 1c and the second wiring member 2c. Therefore, at this time the protection member 3 is hardly melted by the laser beam 4. This prevents the laser beam 4 from piercing the protection member 3 and prevents a molten piece of the molten first wiring member 1c or second wiring member 2c from scattering or dropping.

After this, the first wiring member 1c and the second wiring member 2c are cooled to solidify the welded portion. By doing so, the first wiring member 1c and the second wiring member 2c are bonded together. In this case, the protection member 3 may be disposed on the outside of the member portion 1c2 of the first wiring member 1c and the outside of the member portion 2c2 of the second wiring member 2c with a bonding member (not illustrated) therebetween. This is the same with the first embodiment. Furthermore, in the third embodiment the first wiring member 1c, the second wiring member 2c, and the protection member 3 (and the bonding member) may also be made of the materials illustrated in FIG. 2 or 3.

Fourth Embodiment

In a fourth embodiment, unlike the first through third embodiments, a case where another wiring member is welded to a wiring terminal included in a semiconductor device, for example, in the process of fabricating the semiconductor device will be described with reference to FIGS. 6A and 6B.

Figure 6B:
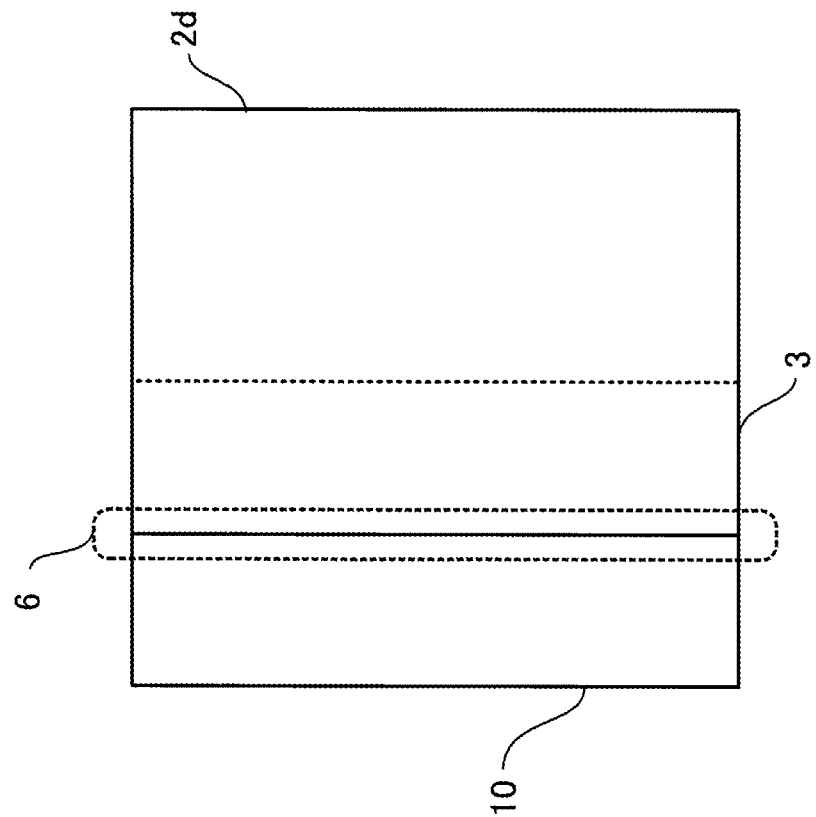
FIGS. 6A and 6B are views for describing a welding method according to a fourth embodiment.
Figure 6A:
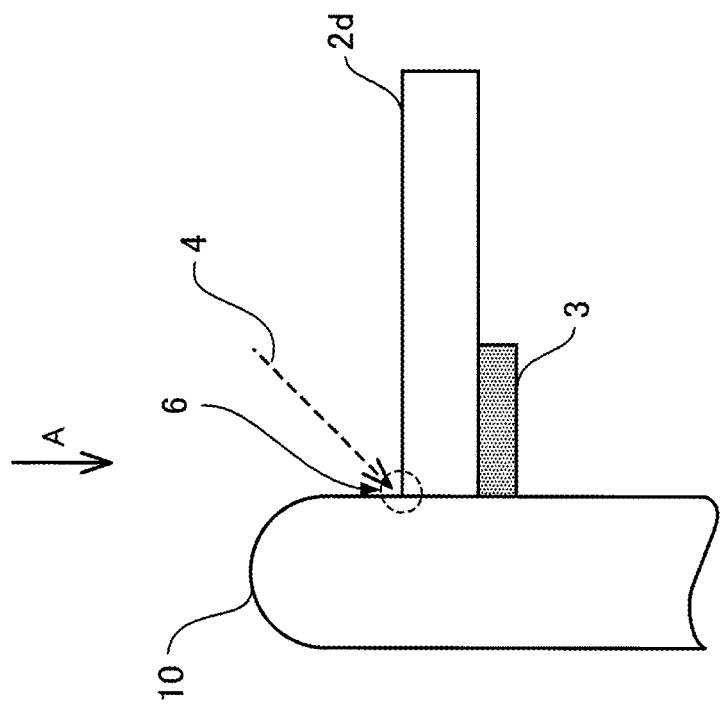

FIGS. 6A and 6B are views for describing a welding method according to a fourth embodiment. FIG. 6A is a side view (corresponding to (C) of FIG. 1) of a bonded terminal 10 and a second wiring member 2d at welding time. FIG. 6B is a top view as viewed in an arrow A direction in FIG. 6A.

In the fourth embodiment each of the bonded terminal 10 and the second wiring member 2d has the shape of a flat plate. In the fourth embodiment a protection member 3 has the shape of a flat plate. This is the same with the first embodiment. In addition, the protection member 3 in the fourth embodiment is also made of a material whose melting point is higher than those of the bonded terminal 10 and the second wiring member 2d.

As illustrated in FIG. 6A, a side of the bonded terminal 10 and a side of the second wiring member 2d are placed together. Furthermore, the protection member 3 is disposed so as to touch the side of the bonded terminal 10 and a lower surface of the second wiring member 2d. That is to say, the protection member 3 is disposed on the side of the back surface of the second wiring member 2d so as to fill the space between the bonded terminal 10 and the second wiring member 2d.

Next, as illustrated in FIGS. 6A and 6B, a joint (irradiation area 6) between the bonded terminal 10 and the second wiring member 2d is irradiated with a laser beam 4. At this time the laser beam 4 generates heat to the extent that the bonded terminal 10 and the second wiring member 2d are melted. In addition, at this time the laser beam 4 is emitted diagonally from above the irradiation area 6. In this case, because of a heat input from the laser beam 4, portions of the bonded terminal 10 and the second wiring member 2d irradiated with the laser beam 4 are melted and a welded portion (not illustrated) is formed. This is the same with the first embodiment. However, the melting point of the protection member 3 is higher than those of the bonded terminal 10 and the second wiring member 2d. Therefore, at this time the protection member 3 is hardly melted by the laser beam 4. This prevents the laser beam 4 from piercing the protection member 3 and prevents a molten piece of the molten bonded terminal 10 or second wiring member 2d from scattering or dropping.

After this, the bonded terminal 10 and the second wiring member 2d are cooled to solidify the welded portion. By doing so, the bonded terminal 10 and the second wiring member 2d are bonded together. In this case, the protection member 3 may be disposed so as to touch the side of the bonded terminal 10 and the lower surface of the second wiring member 2d with a bonding member (not illustrated) therebetween. This is the same with the first embodiment. Furthermore, in the fourth embodiment the bonded terminal 10 (corresponding to the first wiring member), the second wiring member 2d, and the protection member 3 (and the bonding member) may also be made of the materials illustrated in FIG. 2 or 3. In addition, in the fourth embodiment one wiring member, that is to say, the second wiring member 2d is welded to the bonded terminal 10. However, two or more wiring members may be welded in the same way to the bonded terminal 10. In this case, there is need to select the laser power of the laser beam 4 and the thickness of and a material for the protection member 3 according to the thickness of wiring members placed one over another.

Fifth Embodiment

In a fifth embodiment a semiconductor device fabricated by the use of a fabrication method including the welding method according to the first embodiment will be described.

Such a semiconductor device includes a semiconductor element and a first wiring member and second wiring member electrically connected to the semiconductor element and bonded to each other. Furthermore, the semiconductor device includes a protection member. The protection member is disposed under an area opposite an irradiation area of the first wiring member irradiated with a laser beam. The melting point of the protection member is higher than that of at least one of the first wiring member and the second wiring member including the area. The semiconductor device will now be described concretely with reference to FIG. 7.

Figure 7:
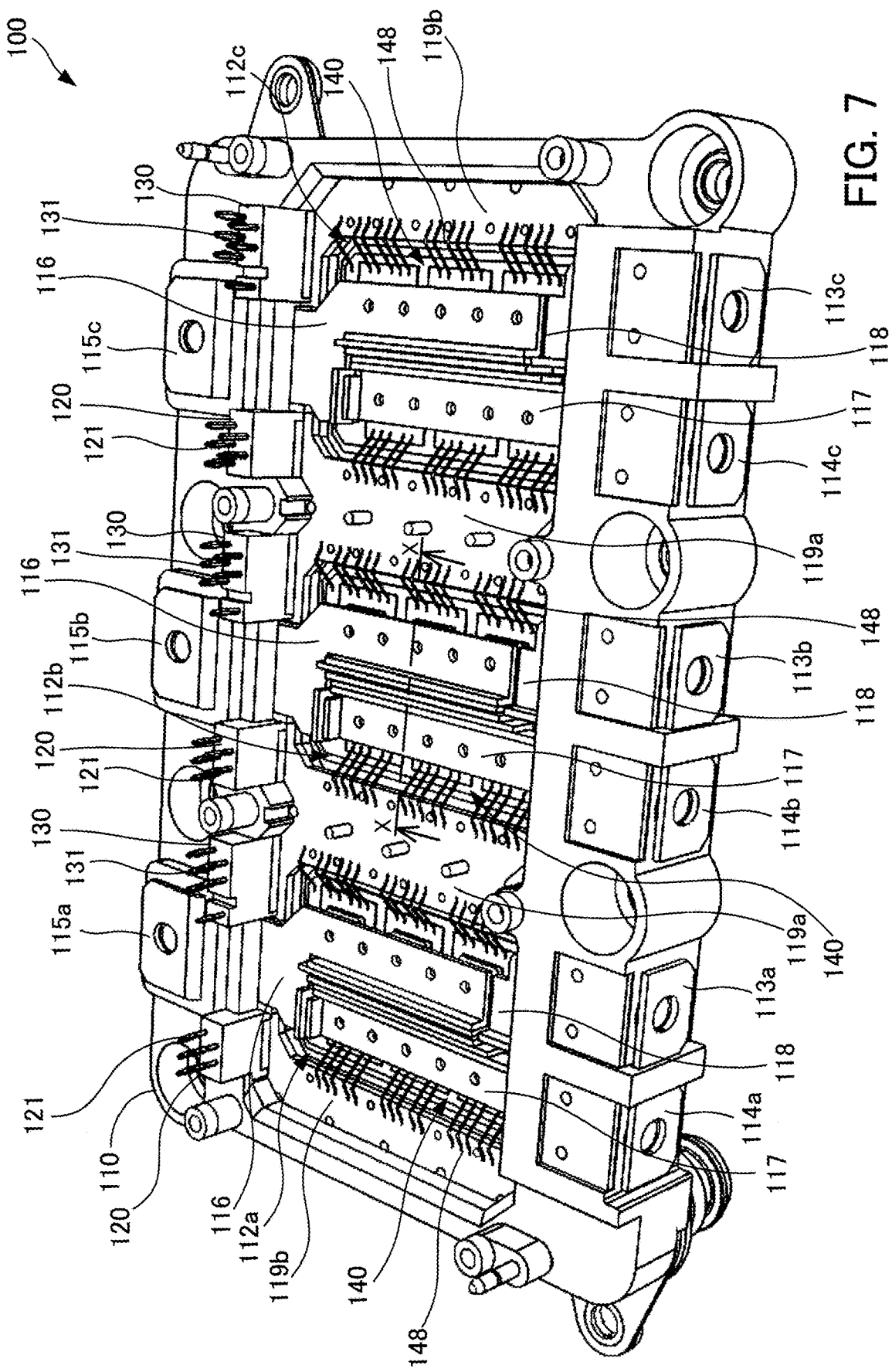
FIG. 7 is a perspective view of a semiconductor device according to a fifth embodiment.

FIG. 7 is a perspective view of the semiconductor device according to the fifth embodiment.

A semiconductor device 100 includes a case 110 and ceramic circuit boards 140 housed in housing sections 112a, 112b, and 112c of the case 110. With the semiconductor device 100, positive electrodes are connected to P terminals 113a, 113b, and 113c and negative electrodes are connected to N terminals 114a, 114b, and 114c. Furthermore, with the semiconductor device 100, a control signal is applied to each control terminal 121 or 131 and an output corresponding to the control signal is obtained from a U terminal 115a, a V terminal 115b, or a W terminal 115c.

For example, the case 110 is formed by injection molding by the use of resin and has the shape of a frame in which a concave portion is formed in the central area. The housing sections 112a, 112b, and 112c in which the ceramic circuit boards 140 are housed are formed in the concave portion formed in the central area. Printed-circuit boards 119a and 119b are disposed (in the lateral direction of the case 110) over a peripheral edge portion of the housing section 112a. A pair of printed-circuit boards 119a are disposed (in the lateral direction of the case 110) over a peripheral edge portion of the housing section 112b. Printed-circuit boards 119a and 119b are disposed (in the lateral direction of the case 110) over a peripheral edge portion of the housing section 112c. The ceramic circuit boards 140 housed in the housing sections 112a, 112b, and 112c are electrically connected by wires 148 to the printed-circuit boards 119a and 119b.

With the housing section 112a of the above case 110, the P terminal 113a and the N terminal 114a are formed on one side in the longitudinal direction of the case 110 (on the lower side in FIG. 7) and the U terminal 115a is formed on the other side in the longitudinal direction of the case 110 (on the upper side in FIG. 7). Similarly, with the housing section 112b of the case 110, the P terminal 113b and the N terminal 114b are formed on the one side in the longitudinal direction of the case 110 (on the lower side in FIG. 7) and the V terminal 115b is formed on the other side in the longitudinal direction of the case 110 (on the upper side in FIG. 7). Furthermore, with the housing section 112c of the case 110, the P terminal 113c and the N terminal 114c are formed on the one side in the longitudinal direction of the case 110 (on the lower side in FIG. 7) and the W terminal 115c is formed on the other side in the longitudinal direction of the case 110 (on the upper side in FIG. 7).

Wiring terminals 118 which are electrically connected to the P terminals 113a, 113b, and 113c and which protrude from the P terminals 113a, 113b, and 113c are disposed in the housing sections 112a, 112b, and 112c respectively. In addition, one end of each of the U terminal 115a, the V terminal 115b, and the W terminal 115c is electrically connected to a first wiring member 116 bonded to a second wiring member (described later). Furthermore, one end of each of the N terminals 114a, 114b, and 114c is electrically connected to a first wiring member 117 bonded to the second wiring member (described later).

In addition, terminal blocks 120 and 130 are disposed on the U terminal 115a side of the printed-circuit boards 119b and 119a, respectively, disposed in the housing section 112a. Control terminals 121 and 131 are electrically connected to the printed-circuit boards 119b and 119a respectively. The terminal blocks 120 and 130 are disposed near the U terminal 115a, the V terminal 115b, and the W terminal 115c formed on the side in the longitudinal direction of the case 110.

Next, the ceramic circuit boards 140 housed in the housing sections 112a, 112b, and 112c in the case 110 of the semiconductor device 100 and second wiring members 145a and 145b and the first wiring members 116 and 117 disposed over each ceramic circuit board 140 will be described with reference to FIGS. 8 and 9.

Figure 8:
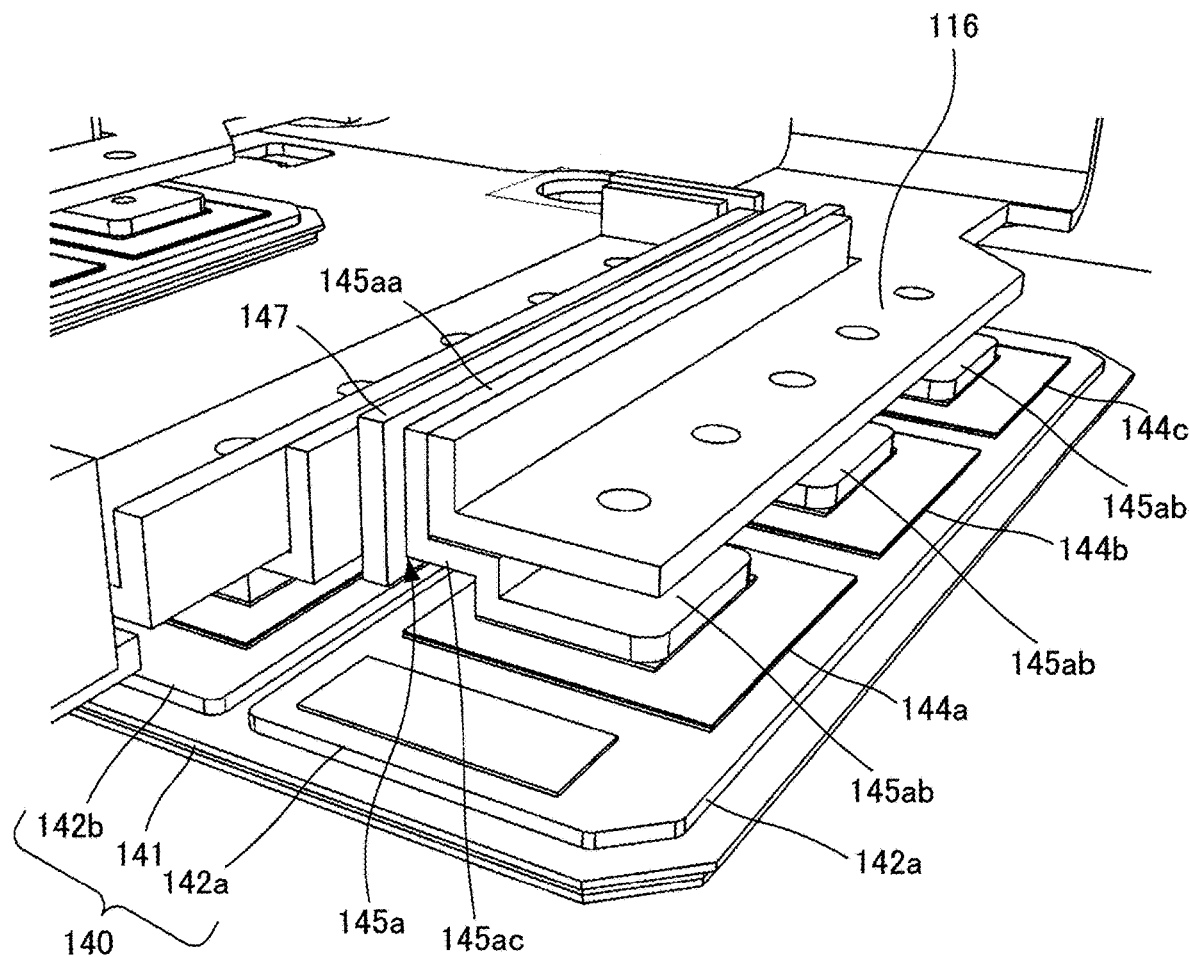
FIG. 8 is a perspective view of a wiring board bonded to a ceramic circuit board included in the semiconductor device according to the fifth embodiment (part 1)
Figure 9:
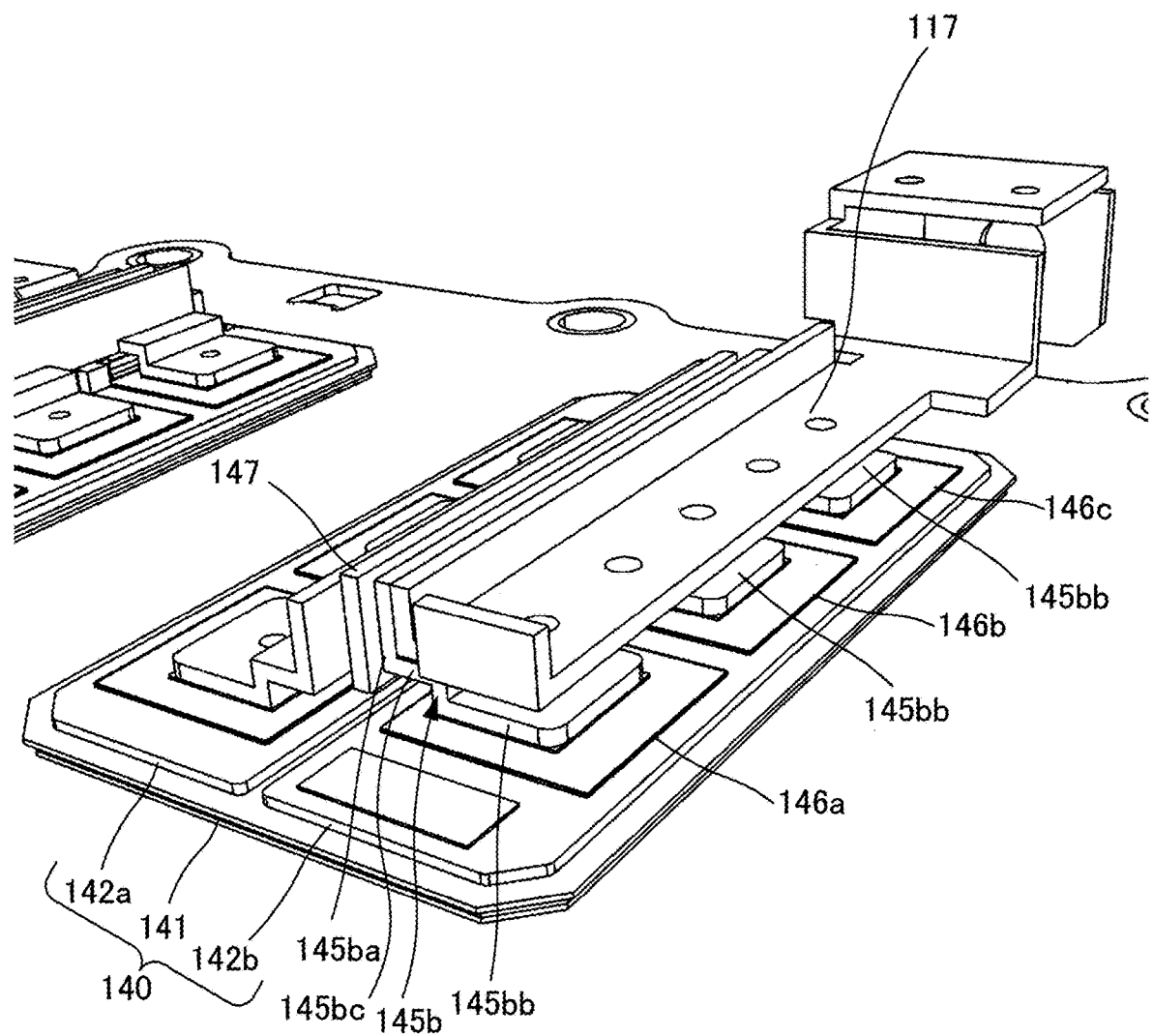
FIG. 9 is a perspective view of a wiring board bonded to a ceramic circuit board included in the semiconductor device according to the fifth embodiment (part 2)

FIGS. 8 and 9 are perspective views of a wiring board bonded to a ceramic circuit board included in the semiconductor device according to the fifth embodiment. FIG. 8 illustrates a side on which the first wiring member 116 is disposed over the ceramic circuit board 140. FIG. 9 illustrates a side on which the first wiring member 117 is disposed over the ceramic circuit board 140. Furthermore, the wiring terminal 118 is not illustrated in FIGS. 8 and 9 in order to make the structure easy to see.

The ceramic circuit board 140 includes an insulating plate 141, circuit boards 142a and 142b formed over the front surface of the insulating plate 141, and a metal plate (not illustrated) formed under the back surface of the insulating plate 141 and made of copper or the like.

The insulating plate 141 is made of a high thermal conductivity ceramic such as aluminum oxide, aluminum nitride, or silicon nitride.

The circuit boards 142a and 142b are made of a metal material having good conductivity and solder wettability. For example, silver, copper, or an alloy containing at least one of them is used as such a material. Furthermore, plating treatment may be performed on the circuit boards 142a and 142b by the use of a material having high corrosion resistance. For example, aluminum, nickel, titanium, chromium, molybdenum, tantalum, niobium, tungsten, vanadium (V), bismuth (Bi), zirconium (Zr), hafnium (Hf), gold, platinum, palladium (Pd), or an alloy containing at least one of them is used as such a material.

The metal plate is made of a high thermal conductivity metal such as aluminum, iron, silver, copper, or an alloy containing at least one of them.

A direct copper bonding (DCB) board, an active metal brazed (AMB) board, or the like is used as the ceramic circuit board 140 having the above structure. The ceramic circuit board 140 conducts heat generated by semiconductor elements 144a, 144b, and 144c downward via the circuit board 142a, the insulating plate 141, and the metal plate and conducts heat generated by semiconductor elements 146a, 146b, and 146c downward via the circuit board 142b, the insulating plate 141, and the metal plate.

Furthermore, the semiconductor elements 144a, 144b, and 144c are disposed over the circuit board 142a of the ceramic circuit board 140 and the semiconductor elements 146a, 146b, and 146c are disposed over the circuit board 142b of the ceramic circuit board 140.

Each semiconductor element is a MOSFET, an IGBT, an FWD, or the like. Furthermore, an RC-IGBT obtained by integrating an IGBT and an FWD, an RB-IGBT having a sufficient breakdown voltage against a reverse bias, or the like is used as a power semiconductor element. In addition, each semiconductor element may be made of any semiconductor such as a Si semiconductor or a SiC semiconductor.

Furthermore, the second wiring member 145a is disposed over the semiconductor elements 144a, 144b, and 144c disposed over the ceramic circuit board 140 and is electrically connected to the semiconductor elements 144a, 144b, and 144c. In addition, the second wiring member 145b is disposed over the semiconductor elements 146a, 146b, and 146c disposed over the ceramic circuit board 140 and is electrically connected to the semiconductor elements 146a, 146b, and 146c. The second wiring members 145a and 145b are insulated by a plate 147 from each other. (Collector electrodes) of the semiconductor elements 144a, 144b, and 144c are brought into line over the circuit board 142a, for example, with solder therebetween. In addition, the second wiring member 145a is disposed with solder therebetween over emitter electrodes of the semiconductor elements 144a, 144b, and 144c brought into line and is electrically connected to the emitter electrodes of the semiconductor elements 144a, 144b, and 144c.

The second wiring member 145a includes a flat plate portion 145aa, a terminal portion 145ab, and a level difference portion 145ac which connects the flat plate portion 145aa and the terminal portion 145ab. Furthermore, the second wiring member 145a is made of copper, aluminum, an alloy containing at least one of them, stainless steel, or the like.

The number of terminal portions 145ab prepared corresponds to the number of semiconductor elements connected thereto. Each terminal portion 145ab is bonded to each of the semiconductor elements 144a, 144b, and 144c with a bonding material, such as solder, therebetween and is connected electrically and mechanically to each of the semiconductor elements 144a, 144b, and 144c.

The flat plate portion 145aa and each terminal portion 145ab electrically connected to each of the semiconductor elements 144a, 144b, and 144c connect by the level difference portion 145ac. In the example of FIG. 8, the principal plane of the flat plate portion 145aa and the principal plane of each terminal portion 145ab are at approximately right angles. The level difference portion 145ac has surfaces approximately parallel to these two principal planes. A section of the second wiring member 145a has a zigzag shape.

As illustrated in FIG. 8, the level difference portion 145ac supports the first wiring member 116 from the underside. Furthermore, the first wiring member 116 is welded to the front surface of the level difference portion 145ac. A protection member is disposed under the underside of the level difference portion 145ac. In FIG. 8, the protection member is not illustrated.

For example, the thickness of each portion of the second wiring member 145a having the above structure is greater than or equal to 1.0 mm and smaller than or equal to 1.5 mm.

(Collector electrodes) of the semiconductor elements 146a, 146b, and 146c are brought into line over the circuit board 142b, for example, with solder therebetween. In addition, the second wiring member 145b is disposed with solder therebetween over emitter electrodes of the semiconductor elements 146a, 146b, and 146c brought into line and is electrically connected to the emitter electrodes of the semiconductor elements 146a, 146b, and 146c.

The second wiring member 145b has the same structure as the second wiring member 145a has. That is to say, the second wiring member 145b includes a flat plate portion 145ba, a terminal portion 145bb, and a level difference portion 145bc which connects the flat plate portion 145ba and the terminal portion 145*bb*. Furthermore, the second wiring member 145*b* is made of copper, aluminum, an alloy containing at least one of them, stainless steel, or the like.

The number of terminal portions 145*bb* prepared corresponds to the number of semiconductor elements connected thereto. Each terminal portion 145*bb* is bonded to each semiconductor element with a bonding material, such as solder, therebetween and is connected electrically and mechanically to each semiconductor element.

The flat plate portion 145*ba* and each terminal portion 145*bb* electrically connected to each semiconductor element connect by the level difference portion 145*bc*. In the example of FIG. 9, the principal plane of the flat plate portion 145*ba* and the principal plane of each terminal portion 145*bb* are at approximately right angles. The level difference portion 145*bc* has surfaces approximately parallel to these two principal planes. A section of the second wiring member 145*b* has a zigzag shape.

As illustrated in FIG. 9, the level difference portion 145*bc* supports the first wiring member 117 from the underside. Furthermore, the first wiring member 117 is welded to the front surface of the level difference portion 145*bc*. A protection member is disposed under the underside of the level difference portion 145*bc*. In FIG. 9, the protection member is not illustrated.

For example, the thickness of each portion of the second wiring member 145*b* having the above structure is greater than or equal to 1.0 mm and smaller than or equal to 1.5 mm.

In addition, in the examples of FIGS. 8 and 9, the semiconductor elements 144*a*, 144*b*, and 144*c* are electrically connected in parallel and the semiconductor elements 146*a*, 146*b*, and 146*c* are electrically connected in parallel. The number of semiconductor elements may be increased or decreased according to the capacity of the semiconductor device. Furthermore, with the ceramic circuit board 140 alignment is performed between the semiconductor elements 144*a*, 144*b*, and 144*c* and 146*a*, 146*b*, and 146*c* and the circuit boards 142*a* and 142*b*, respectively, on the basis of the disposed plate 147. After that, the second wiring members 145*a* and 145*b* are disposed.

A method for fabricating the semiconductor device 100, including the process for welding the first wiring members 116 and 117 to the second wiring members 145*a* and 145*b*, respectively, will now be described with reference to FIG. 10.

Figure 10:
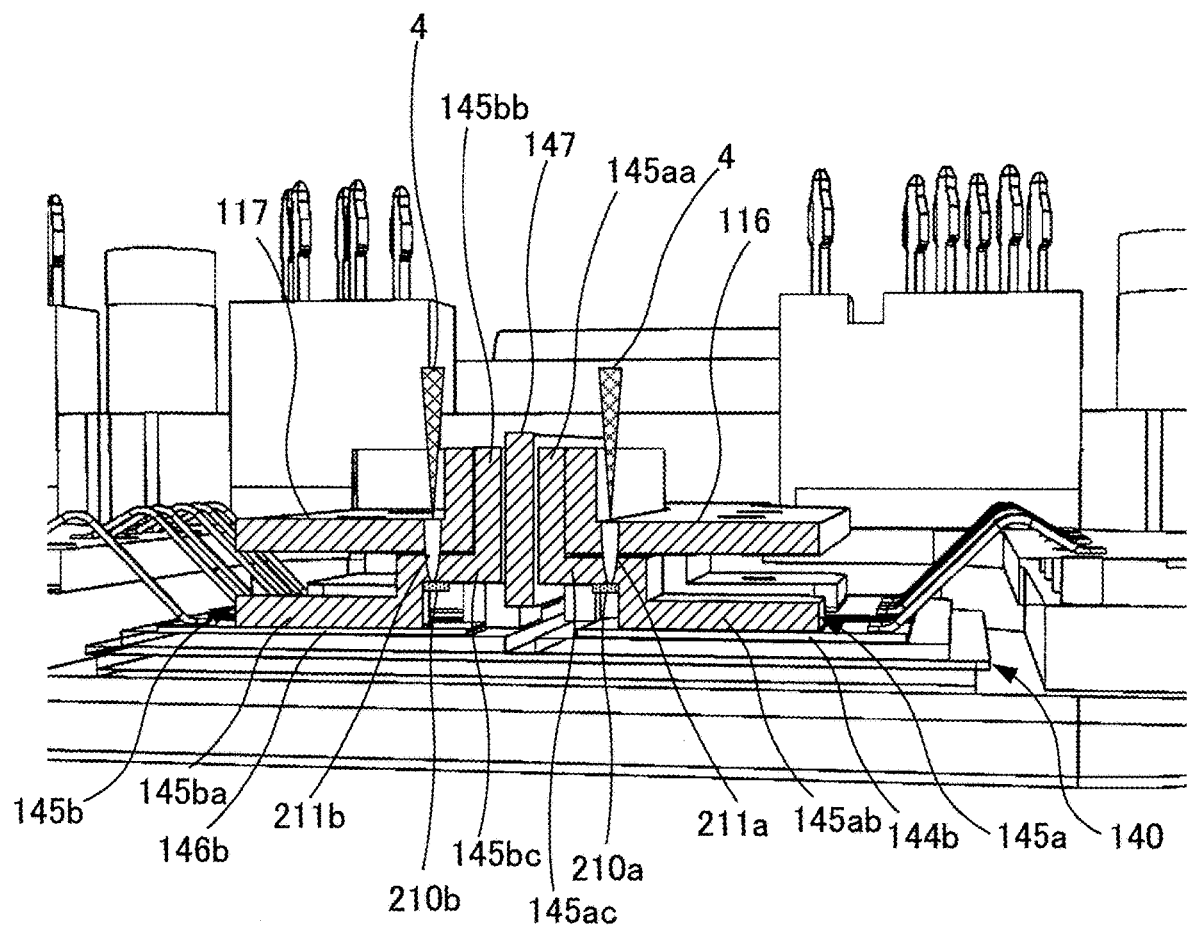
FIG. 10 is a sectional view of the wiring board bonded to the ceramic circuit board included in the semiconductor device according to the fifth embodiment.

FIG. 10 is a sectional view of the wiring board bonded to the ceramic circuit board included in the semiconductor device according to the fifth embodiment. FIG. 10 is a sectional view taken along the dot-dash line X-X of FIG. 7.

As stated above, with the second wiring members 145*a* and 145*b* disposed over the ceramic circuit board 140 included in the semiconductor device 100 having the above structure, the first wiring members 116 and 117 are disposed over the level difference portions 145*ac* and 145*bc* respectively.

In order to fabricate the semiconductor device 100, first the printed-circuit boards 119*a* and 119*b* over which the terminal blocks 120 and 130 are disposed, the wiring terminals 118, the P terminals 113*a*, 113*b*, and 113*c*, the N terminals 114*a*, 114*b*, and 114*c*, the U terminal 115*a*, the V terminal 115*b*, the W terminal 115*c*, and the like are integrally molded by the use of resin to form the case 110 (see FIG. 7).

Furthermore, the semiconductor elements 144*b* and 146*b*, the first wiring members 116 and 117, the second wiring members 145*a* and 145*b*, and protection members 210*a* and 210*b* whose melting points are higher than those of the second wiring members 145*a* and 145*b*, respectively, are prepared.

Next, the protection members 210*a* and 210*b* are formed under the back surfaces of the level difference portions 145*ac* and 145*bc* of the second wiring members 145*a* and 145*b* (opposite the ceramic circuit board 140) over whose front surfaces the first wiring members 116 and 117, respectively, are disposed. For example, the protection members 210*a* and 210*b* made of a titanium alloy are roll-bonded to determined portions of the second wiring members 145*a* and 145*b*, respectively, made of copper and are worked into determined shape. That is to say, the protection members 210*a* and 210*b* are disposed under the back surfaces of the level difference portions 145*ac* and 145*bc* of the second wiring members 145*a* and 145*b* opposite irradiation areas of the first wiring members 116 and 117, respectively, irradiated with the laser beam 4.

Next, the semiconductor element 144*b* and the second wiring member 145*a* are connected electrically and mechanically by a bonding material such as solder. The semiconductor element 146*b* and the second wiring member 145*b* are connected electrically and mechanically by a bonding material such as solder. At this time the ceramic circuit board 140 and the plate 147 prepared separately are disposed. By doing so, the second wiring members 145*a* and 145*b* and the plate 147 are located and the ceramic circuit board 140 over which the semiconductor elements 144*b* and 146*b* are disposed is obtained.

Next, as illustrated in FIG. 7, the ceramic circuit boards 140 are housed in the housing sections 112*a*, 112*b*, and 112*c* of the case 110 formed in this way. At this time part of the circuit board 142*a* of each ceramic circuit board 140 and part of the circuit board 142*b* of each ceramic circuit board 140 are electrically connected by the wires 148 or the like to the wiring terminal 118 of the case 110 and the printed-circuit boards 119*a* and 119*b*.

Next, as illustrated in FIG. 7, the first wiring members 116 are bonded to one end of the U terminal 115*a* of the case 110, one end of the V terminal 115*b* of the case 110, one end of the W terminal 115*c* of the case 110, and the level difference portions 145*ac* of the second wiring members 145*a*.

At this time the protection members 210*a* are disposed under the back surfaces of the level difference portions 145*ac* of the second wiring members 145*a*. The first wiring members 116 are placed over the level difference portions 145*ac* of the second wiring members 145*a*. Furthermore, as illustrated in FIG. 10, the laser beam 4 which generates heat to the extent that the first wiring member 116 and the level difference portion 145*ac* of the second wiring member 145*a* are melted is emitted. As a result, because of a heat input from the laser beam 4, the first wiring member 116 and the level difference portion 145*ac* of the second wiring member 145*a* are melted and a welded portion 211*a* is formed. However, the melting point of the protection member 210*a* is higher than that of the second wiring member 145*a*. Therefore, at this time the protection member 210*a* is hardly melted by the laser beam 4. This prevents the laser beam 4 from piercing the protection member 210*a* and prevents a molten piece of the molten level difference portion 145*ac* of the second wiring member 145*a* from scattering or dropping. As a result, damage to a component, such as the ceramic circuit board 140 in the housing section 112*a*, 112*b*, or 112*c*, is prevented.

After this, the first wiring member 116 and the second wiring member 145*a* are cooled to solidify the welded portion 211*a*. As a result, the first wiring member 116, the U terminal 115a, the V terminal 115b, the W terminal 115c, and the second wiring member 145a are electrically connected.

Furthermore, the first wiring members 117 are bonded to one end of the N terminal 114a of the case 110, one end of the N terminal 114b of the case 110, one end of the N terminal 114c of the case 110, and the level difference portions 145bc of the second wiring members 145b. At this time the first wiring member 117 and the level difference portion 145bc of the second wiring member 145b are welded together in the same way as described above (see FIG. 10) and a welded portion 211b is formed. Cooling is performed to solidify the welded portion 211b. As a result, the first wiring member 117, the N terminals 114a, 114b, and 114c, and the second wiring member 145b are electrically connected.

Finally, the ceramic circuit boards 140, the printed-circuit boards 119a and 119b, the first wiring members 116 and 117, the wiring terminals 118, the wires 148, and the like in the concave portion of the case 110 are sealed with sealing resin and the sealing resin is hardened. As a result, the semiconductor device 100 is completed. For example, epoxy resin is used as the sealing resin.

In the fifth embodiment the second wiring members 145a and 145b under which the protection members 210a and 210b are disposed are bonded to the semiconductor elements 144a, 144b, and 144c and the semiconductor elements 146a, 146b, and 146c respectively. The first wiring members 116 and 117 irradiated with the laser beam 4 are bonded to the external connection terminals (N terminals 114a, 114b, and 114c, the U terminal 115a, the V terminal 115b, and the W terminal 115c). However, another structure may be adopted. That is to say, the second wiring members 145a and 145b under which the protection members 210a and 210b, respectively, are disposed are bonded to the external connection terminals and the first wiring members 116 and 117 irradiated with the laser beam 4 are bonded to the semiconductor elements 144a, 144b, and 144c and the semiconductor elements 146a, 146b, and 146c respectively.

With the above semiconductor device 100 the above welding is performed to bond the second wiring members 145a and 145b and the first wiring members 116 and 117, respectively, together. This prevents a molten piece from scattering or dropping from the back surface of the level difference portion 145ac or 145bc of the second wiring member 145a or 145b. Accordingly, damage to a component, such as the ceramic circuit board 140 in the housing section 112a, 112b, or 112c, is prevented and deterioration in the reliability of the semiconductor device 100 is suppressed.

With the semiconductor device having the above structure, the occurrence of piercing caused by welding is prevented and damage to a component around a wiring member is checked. Furthermore, even if a wiring member is thin, good bonding is performed. As a result, reliable bonding between wiring members is realized and reliability is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
    a semiconductor element;
    a first wiring member and a second wiring member bonded to each other and being electrically connected to the semiconductor element, the first wiring member having an irradiation area for receiving irradiation of a laser beam; and
    a protection member disposed on an area of the second wiring member opposite the irradiation area of the first wiring member, the protection member having a melting point higher than a melting point of at least one of the first wiring member and the second wiring member including the area on which the protection member is disposed.

2. The semiconductor device according to claim 1, wherein:
    the second wiring member is bonded to the first wiring member at a bonding plane;
    the irradiation area is on a first principal plane of the first wiring member opposite the bonding plane; and
    the area on which the protection member is disposed is on a second principal plane of the second wiring member opposite the bonding plane.

3. The semiconductor device according to claim 2, wherein one or more wiring members are laminated between the first wiring member and the second wiring member.

4. The semiconductor device according to claim 1, wherein:
    the second wiring member is bonded to the first wiring member at a bonding plane;
    the irradiation area of the first wiring member is on one end portion of the first wiring member corresponding to one end portion of the second wiring member perpendicular to the bonding plane; and
    the area on which the protection member is disposed is on another end portion of the second wiring member opposite the irradiation area.

5. The semiconductor device according to claim 1, wherein the protection member is made of cobalt, titanium, platinum, chromium, molybdenum, tantalum, tungsten, niobium, an alloy containing at least one of cobalt, titanium, platinum, chromium, molybdenum, tantalum, tungsten, and niobium, or a ceramic material.

6. The semiconductor device according to claim 5, wherein the ceramic material is aluminum oxide, zirconium oxide, silicon oxide, silicon carbide, boron carbide, tungsten carbide, tantalum carbide, aluminum nitride, silicon nitride, titanium nitride, or tantalum nitride.

7. The semiconductor device according to claim 1, wherein the protection member is disposed on the first wiring member and the second wiring member bonded together, with a bonding member therebetween.

8. The semiconductor device according to claim 1, wherein the first wiring member and the second wiring member are made of copper, aluminum, an alloy containing at least one of copper and aluminum, or stainless steel.

9. The semiconductor device according to claim 1, wherein a difference in melting point between the at least one of the first wiring member and the second wiring member and the protection member is 500° C. or more.

10. A semiconductor device fabrication method comprising:
    preparing a semiconductor element, a first wiring member, a second wiring member, and a protection member having a melting point higher than a melting point of the second wiring member;

before placing the first wiring member over the second wiring member and irradiating a laser beam thereto, ascertaining an irradiation area on the first wiring member for receiving the irradiation, and a protection area on the second wiring member, and disposing the protection member on the protection area;

electrically connecting the semiconductor element and at least one of the first wiring member and the second wiring member;

placing the first wiring member over the second wiring member, the protection area of the second wiring member opposite to the irradiation area of the first wiring member; and irradiating the irradiation area with the laser beam.

11. The semiconductor device fabrication method according to claim 10, wherein the protection area of the second wiring member is reachable by the laser beam irradiated at the irradiation area of the first wiring member.

* * * * *